(12) United States Patent
Davoine et al.

(10) Patent No.: US 7,717,718 B2
(45) Date of Patent: May 18, 2010

(54) ELECTRIC COMPONENT HAVING MICROTIPS AND DUCTILE CONDUCTING BUMPS

(75) Inventors: Cécile Davoine, Le Havre (FR); François Marion, St Martin le Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/662,964

(22) PCT Filed: Sep. 29, 2005

(86) PCT No.: PCT/FR2005/050793
§ 371 (c)(1),
(2), (4) Date: Nov. 23, 2007

(87) PCT Pub. No.: WO2006/037915
PCT Pub. Date: Apr. 13, 2006

(65) Prior Publication Data
US 2008/0146071 A1   Jun. 19, 2008

(30) Foreign Application Priority Data
Oct. 4, 2004   (FR) .................................. 04 52252

(51) Int. Cl.
*H01R 12/00* (2006.01)
(52) U.S. Cl. ...................................................... 439/74
(58) Field of Classification Search ................... 439/66, 439/76.1, 83, 84, 74

See application file for complete search history.

(56) References Cited

U.S. PATENT DOCUMENTS

| | | | | |
|---|---|---|---|---|
| 5,137,461 | A * | 8/1992 | Bindra et al. | 439/74 |
| 5,984,691 | A * | 11/1999 | Brodsky et al. | 439/66 |
| 6,072,326 | A * | 6/2000 | Akram et al. | 324/765 |
| 6,224,396 | B1 * | 5/2001 | Chan et al. | 439/66 |
| 6,291,897 | B1 * | 9/2001 | Wark et al. | 257/786 |
| 6,450,821 | B2 * | 9/2002 | Otsuki et al. | 439/70 |
| 6,454,157 | B2 * | 9/2002 | Olson | 228/180.21 |
| 6,650,133 | B1 * | 11/2003 | Deng | 324/761 |
| 7,311,554 | B1 * | 12/2007 | Jackson et al. | 439/584 |
| 2002/0153608 | A1 | 10/2002 | Okada et al. | 257/737 |
| 2003/0234277 | A1 | 12/2003 | Dias et al. | 228/180.22 |
| 2007/0081390 | A1 * | 4/2007 | Yeh et al. | 365/185.21 |

OTHER PUBLICATIONS http://en.wikipedia.org/wiki/Lead ; ( the Wikimedia Foundation, Inc, Copyright (C) 2000,2001,2002 ).*

(Continued)

*Primary Examiner*—Neil Abrams
*Assistant Examiner*—Phuong Nguyen
(74) *Attorney, Agent, or Firm*—Nixon Peabody LLP

(57) ABSTRACT

A component and process for making an electrical connection between a first component comprising a set of first pads and a set of hard conducting tips on one face, and a second component comprising a set of second pads and a set of ductile conducting bumps on the other face, in which the two faces are made to face each other and they are brought towards each other such that the tips can penetrate into these bumps, in which the space between two tips is less than the width of a bump and less than the width of a first pad. The process is applicable to such a component on which the set of conducting tips are installed.

17 Claims, 7 Drawing Sheets

OTHER PUBLICATIONS http://en.wikipedia.org/wiki/Platinum; ( the Wikimedia Foundation, Inc, Copyright (C) 2000,2001,2002 ).*

InternationalPreliminary Seach Report, PCT/FR2005/050793, 7 pgs., (Sep. 29, 2005).

Search Report No. PCT/FR2005/050793, 2 pgs., (Feb. 27, 2006).

* cited by examiner

ELECTRIC COMPONENT HAVING MICROTIPS AND DUCTILE CONDUCTING BUMPS

CROSS REFERENCE TO RELATED APPLICATIONS OR PRIORITY CLAIM

This application is a national phase of International Application No. PCT/FR2005/050793 entitled "Component Provided With An Assembly Of Hard Conductive Microtips And Method For Electrical Connection Of Said Component And A Component Provided With Ductile Conductive Protrusions", which was filed on Sep. 29, 2005, which was not published in English, and which claims priority of the French Patent Application Nos. 04 52252 filed Oct. 4, 2004.

TECHNICAL FIELD

This invention relates to a component provided with a set of hard conducting tips and a process for making an electrical connection between this component and a component provided with ductile conducting bumps.

STATE OF PRIOR ART

The current trend in the field of connections using the "flip chip" technique is to reduce the pitch, in other words the distance between interconnections between the chip and the substrate. With such a technique, all contacts with a substrate are in the form of micro-balls or metallic bumps located on a single face. The chip is turned over such that the bumps can be soldered to appropriate conductors on this chip. However, conventional hybridizing methods such as brazing of micro-balls or thermo compression of pads, and more recent methods such as ACF ("Anisotropic Conductive Films") or the use of conducting polymers are reaching their limits in terms of reducing the pitch.

Making electrical connections by insertion of hard conducting microtips or tips into ductile conducting micro-balls appears to be a solution compatible with such a reduction in the pitch to the extent that it is "flux free", it requires a low mechanical pressure and it is capable of compensating for any distortions in the chip or the substrate.

Document reference [1] at the end of the description thus discloses a process for making a connection by inserting a first part provided with several tips into a second part provided with pads on which micro-solder balls are mounted, without using any flux. This process includes steps consisting of creating a vacuum on the first part, pressing at least one tip of the first part into contact with a pad of the second part, using this tip to pierce the native oxide crust on the surface of the micro-solder ball by heating it to above the melting temperature of the material from which the micro-ball is made, cooling it and then solidifying the molten micro-solder ball. The surface of the solder micro-ball is coated with an oxide film as a hard coating, such that even if the tip is pressed firmly in contact with the micro-solder ball by heating it above the melting temperature of the material from which the micro-ball is made, the solder does not run on the side and a solder bridge is not produced.

The main advantage of such a process for making an electrical connection by insertion is that it eliminates the need for flux, unlike conventional hybridizing methods (brazing of micro-balls and thermo-compression) that make use of a chemical attack solution (the flux) capable of eliminating the native oxide layer on the surface of the alloy. With these methods, the flux rinsing step is difficult to perform at small pitches. Flux residues actually form an obstacle to propagation of the coating glue used to reinforce thermo mechanical coupling between the chip and the substrate when they are used hot or cold, which leads to the presence of bubbles that have a negative thermo mechanical effect on stacking.

Furthermore, conventional hybridizing methods such as brazing of micro-balls and thermo-compression require a temperature increase above the melting temperature of the alloy used as the electrical connection, which can cause deterioration of the components to be hybridized. Furthermore, due to the difference in the thermal expansion coefficients of the chip and the substrate, pads that are supposed to be facing each other are actually offset. This is why this offset in the case of hybridizing with a very small pitch can lead to missing connections around the periphery of the chip. Therefore it is useful to work at low temperatures.

If the electrical contact is made by insertion of one material into another and the mechanical support is assured by a coating glue, theoretically there is no need to increase the temperature. However, the assembly can be heated moderately during hybridizing, so as to soften the micro-ball. This can be done at moderate temperature, for example ⅔ of the melting temperature of the material from which the micro-ball is made. Furthermore, heating after insertion is also possible so as to give a good electrical contact. In this case, there is no problem with an offset of pads facing each other during hybridizing.

Furthermore, as the interconnection density increases, the pressure to be applied when the chip is transferred by thermo compression, ACF or the use of conducting polymers also increases, which reduces the precision of alignment. This is an important point if the connection density is high. However, the shape of the tips is such that reasonable pressures can be applied for insertion; in other words, pressures that are compatible with existing "flip chip" machines.

Finally, a connection with different insertion depths can be made to eliminate the effect of planeness defects of the substrate or the chip, and ball thickness irregularities.

However, making a connection by insertion of a tip in a micro-ball does require an additional alignment level not necessary with conventional "flip chip" methods. The pads, balls and tips all have to be precisely aligned.

The purpose of the invention is to overcome this disadvantage using a set of tips to eliminate the alignment level of the tips above the pads.

PRESENTATION OF THE INVENTION

This invention relates to a process for making an electrical connection between a first component comprising a set of first pads and a set of hard conducting tips on one face, and a second component comprising a set of second pads and a set of ductile conducting bumps on the other face, in which the two faces are made to face each other and they are brought towards each other such that the tips can penetrate into these bumps, characterized in that the space between two tips is less than the width of a bump and the width of a first pad.

In one embodiment, the bumps are obtained by deposition of material at the bottom of the cavities above each second pad or by etching.

In one embodiment, the tips are obtained by metallic deposition, electrolytic growth, metallic nanoprinting, etching or growth of aligned nanotubes.

The invention also relates to a component comprising a set of first pads and a set of hard conducting tips on one face, that can be electrically connected with another component provided with a set of second pads and a set of ductile conducting bumps on one face, characterized in that the space between two tips is less than the width of a bump and less than the width of a first pad.

Each bump is made of an electrical conducting material, for example such as a brazing paste or a conducting glue.

Each tip may be made of metal, and more generally of a conducting material. Each tip may also be a nanotube or a nanowire.

DETAILED PRESENTATION OF PARTICULAR EMBODIMENTS

The process according to the invention is an electrical connection process for pads using the "flip chip" technique.

Figure 1A:
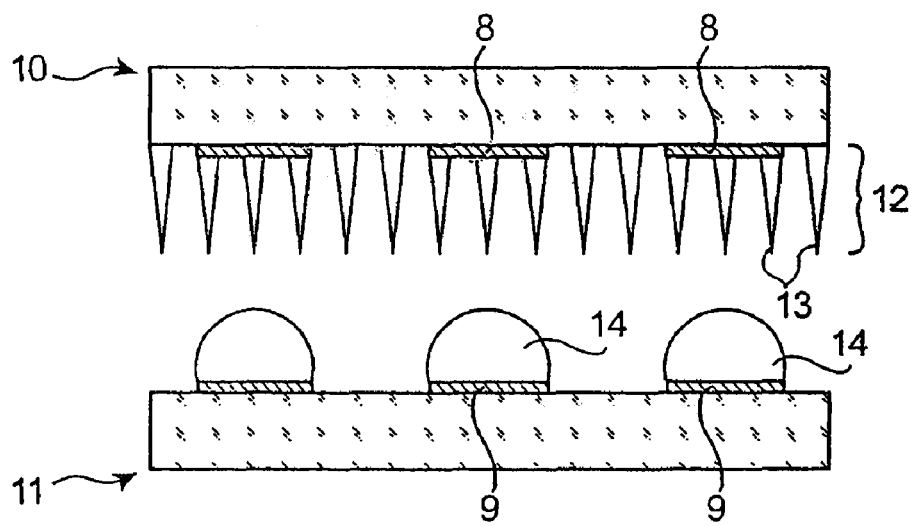
FIGS. 1A and 1B show production of a connection by inserting a set of tips into bumps using the process according to the invention.
Figure 1B:
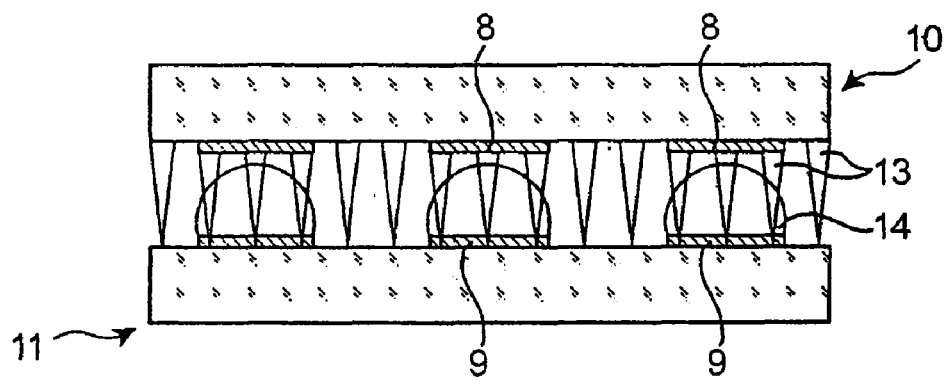

In the process according to the invention, this connection between the pads 8 of a first component 10 and the pads 9 of a second component 11, for example a substrate, is made by inserting a "mat" or set 12 of hard conducting tips 13 arranged on one face of this first component 10 into a set of micro-balls or ductile conducting bumps 14 located on one face of the second component, as shown in FIGS. 1A and 1B. In an embodiment, as shown in figure 1B, the set 12 of hard conducting tips 13 penetrate through at least a substantial portion of the bumps 14 and preferably through a central bottom portion of the bumps (as indicated by the middle tips 13 located in the middle of the respective bumps 14 in FIG. 1B. As shown in FIGS. 1A and 1B, the set 12 of tips 13 are preferably equally and linearly spaced with one another across the face between the face's opposing sides. The equally spaced tips 13 thus allow the tips 13 to pierce the bumps 14 without requiring the precision required in prior art systems.

Figure 2:
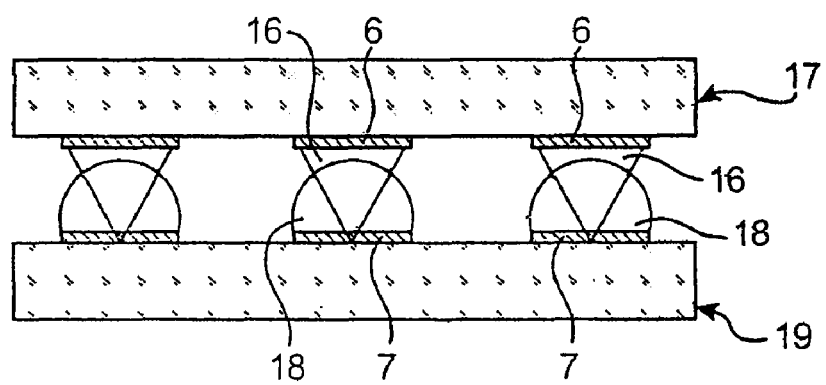
FIG. 2 shows a process according to prior art.

The concept of making connections by insertion is known. For example, it is described in document reference [1]. But in this document, the connection between pads 6 and 7 of the two components 17 and 19 is made by making each microtip 16 of the first component 17 correspond to a ball 18 of the second component 19 that the tip can pierce, as shown in FIG. 2.

Figure 3:
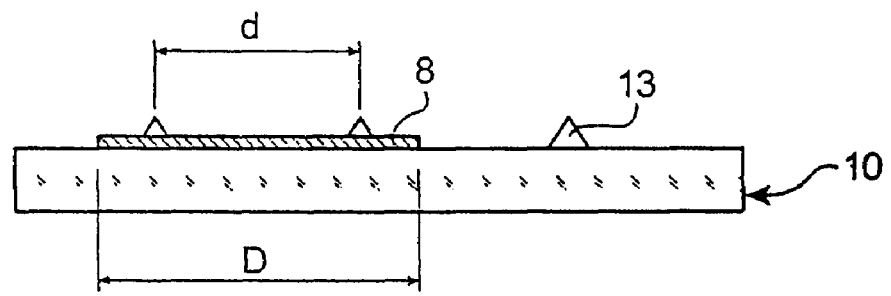
FIGS. 3 and 4 show several characteristics of the process according to the invention.

The invention that thus makes a "mat" of tips has two advantages. Firstly, there is no need for an alignment level during their manufacturing. It is not always necessary to align the tips 13 on the pads 8 as is the case for unit tips according to prior art shown in FIG. 2. All that is necessary is to make the "mat" of tips 13 such that the distance d between two tips 13 is less than the width D of a connection pad 8 as shown in FIG. 3. Thus, there is no doubt that there is at least one tip 13 per pad 8. Secondly, the fact that there is a "mat" of tips means that less precision on the alignment is necessary.

Figure 4:
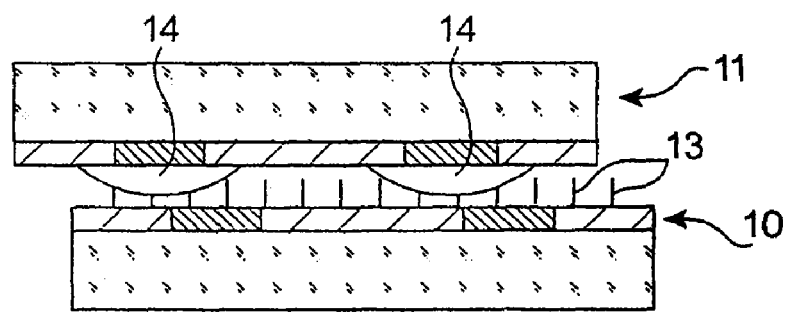

Furthermore, all that is necessary for the contact to be made despite the misalignment is for the distance between the two tips 13 to be less than the width of a ball 14 as shown in FIG. 4. This assures that there is at least one tip that is inserted into a micro-ball.

This type of insertion can be made by varying the values of Young's modulus of the corresponding materials from which the tips 13 and the micro-balls 14 are made, and/or the shape of the tips 13. Insertion becomes easier as the ratio between the values of the Young's modulus of the two materials increases. Therefore, any pair of conducting materials can be chosen; for example a metal tip and a micro ball made of a brazing paste (In, SnPb, AuSn . . . ). Furthermore, the more pointed the tip, the less pressure has to be applied. The tips 13 must be sufficiently hard and thin, for example having:

an angle of less than 30° at the vertex,
a ratio of more than 10 between the value of the Young's modulus of the tip and the bump, so that the tip can pierce the oxide crust and penetrate into the micro-balls 14 is possible with minimum mechanical pressure.

Making the Bumps

Figure 5A:
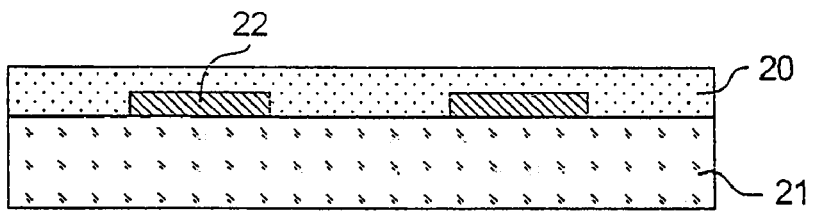
FIGS. 5A to 9C show several embodiments of the process according to the invention.
Figure 5B:
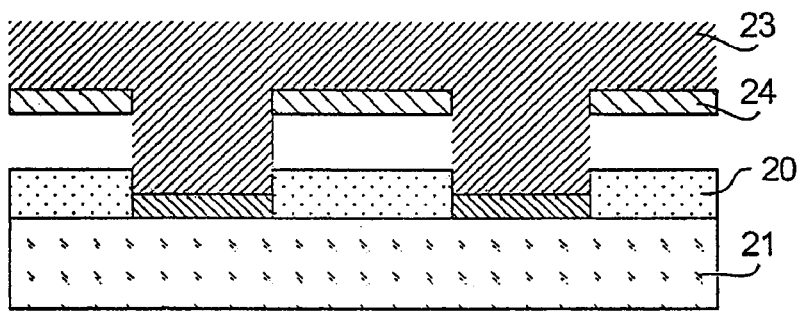
Figure 5C:
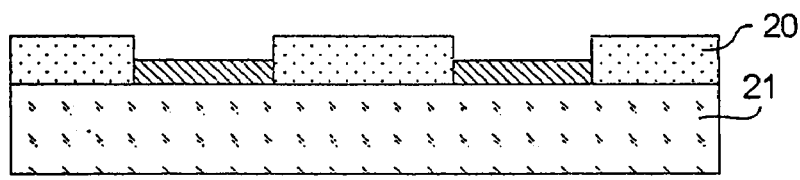
Figure 5D:
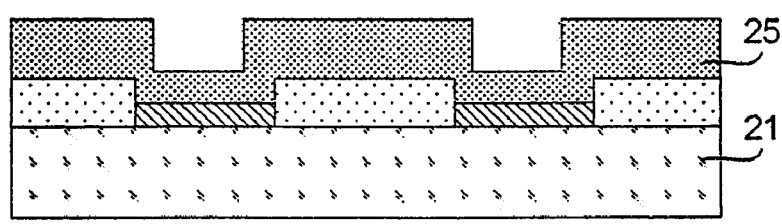
Figure 5E:
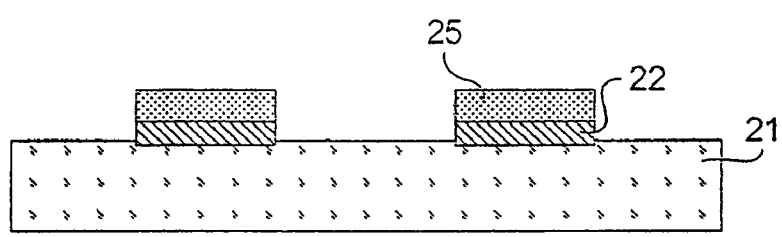
Figure 5F:
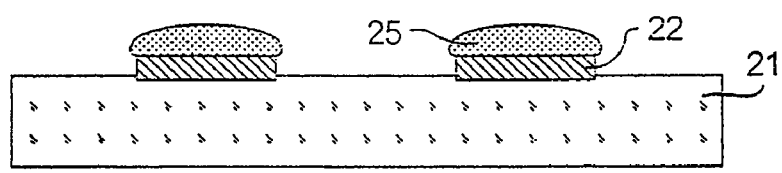

The bumps may be obtained conventionally by deposition at the bottom of resin cavities above each electrical contact (conventional "lift-off" or resin lift-off process). Thus, there are the following steps:

a step to deposit the solid board of resin 20 on a substrate 21 provided with pads 22 (FIG. 5A),
a step of insolation by ultraviolet radiation 23 under mask 24 (FIG. 5B),
a step in which the insolated resin is removed (FIG. 5C),
a step in which the material 25 forming the micro-balls is deposited (FIG. 5D),
a step in which the resin is removed (FIG. 5E) using a resin developer,
an optional step in which the material is remelted to form a ball (FIG. 5F).

The bumps can also be made using another conventional process; deposit of the ductile material over the entire surface and then etching through a mask.

Making the Tips

The set of tips may be obtained in several ways, for example by metallic deposition, etching, electrolytic growth, "electroless" electrodeposition process, metallic nanoprint or growth of aligned carbon nanotubes . . .

1) Metallic Deposit

A first technique consists of making a metallic deposit by sputtering or evaporation above resin cavities. As the deposition continues, the opening closes up and the quantity of metal deposited at the bottom of the cavity reduces. Thus, the shape obtained at the bottom of the cavity becomes conical.

Figure 6A:
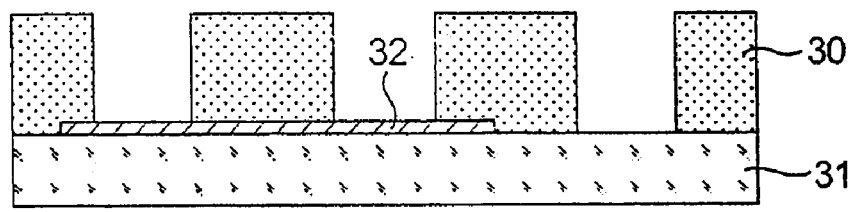
Figure 6B:
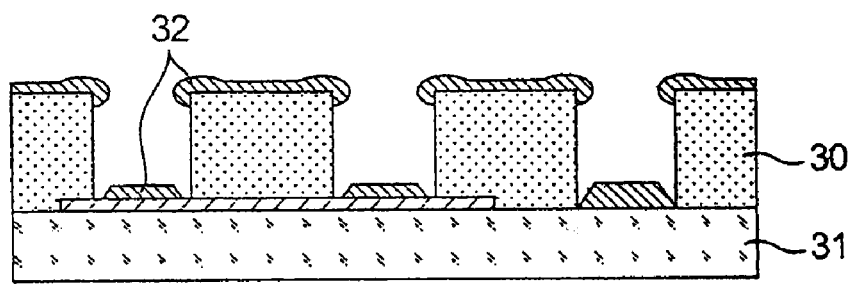
Figure 6C:
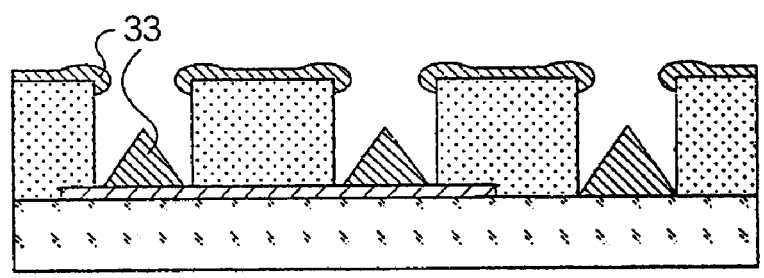
Figure 6D:
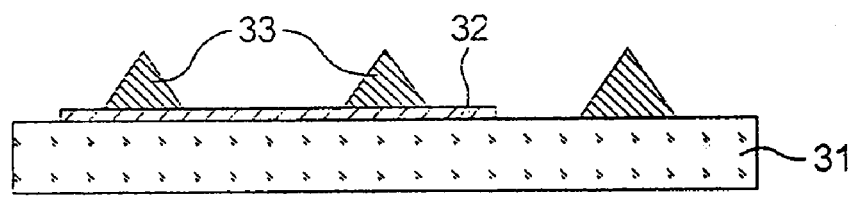

Thus, there are the following steps:

a step to deposit a resin mask 30 by photolithography on a substrate 31 provided with pads 32 (FIG. 6A),
a step in which a metal 33 is deposited (FIGS. 6B and 6C),
a step in which the resin is removed (FIG. 6D).

A second technique consists of making the same deposit but over the entire surface, to deposit a resin mask and then to etch the metal by chemical etching.

2) Electrolytic Growth

Electrolytic growth of a metal can also be achieved at the bottom of a resin cavity with oblique sides. This obliqueness may for example be obtained by double resin coating. Two types of resins are then deposited that do not have the same sensitivity to insolation. Once insolated, they do not dissolve in the same way.

Figure 7A:
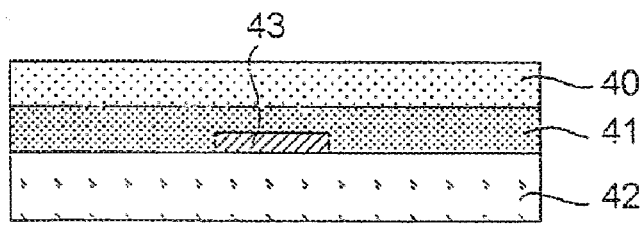
Figure 7B:
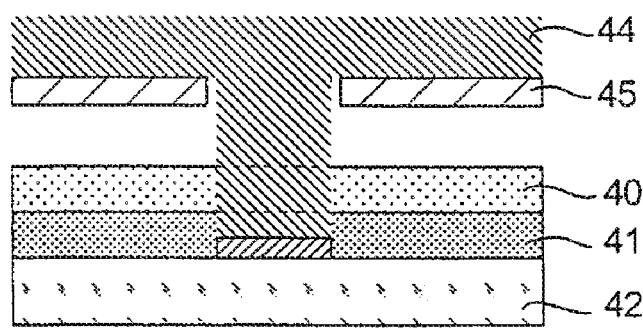
Figure 7C:
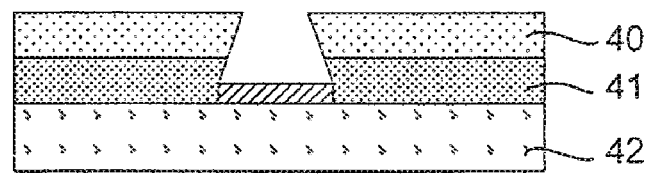
Figure 7D:
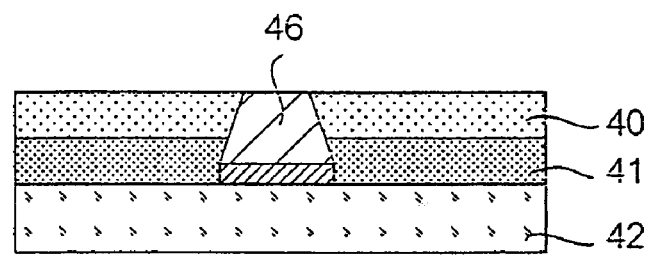
Figure 7E:
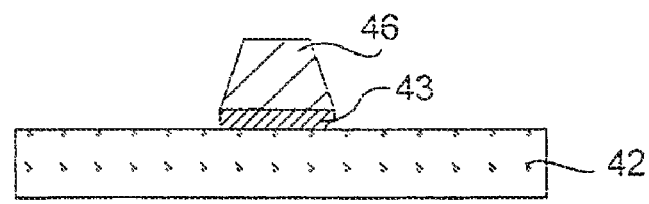

Thus, there are the following steps:

a step to create a double resin coating by deposition of two resins 40 and 41 on a substrate 42 provided with pads 43 (FIG. 7A),
an insolation step with ultraviolet radiation 44 under a mask 45 (FIG. 7B),
a step in which the insolated resins are diluted (FIG. 7C), a step of electrolytic deposition of the material 46 making up the tips (FIG. 7D), a step in which the two resins 40 and 41 are removed (FIG. 7E).

3) Metallic Nanoprint

Originally, it would also be possible to mould alloys provided that they are heated to around the melting temperature. Alloys with a low melting point have to be chosen.

Figure 8A:
Figure 8B:
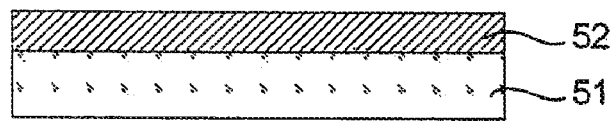
Figure 8C:
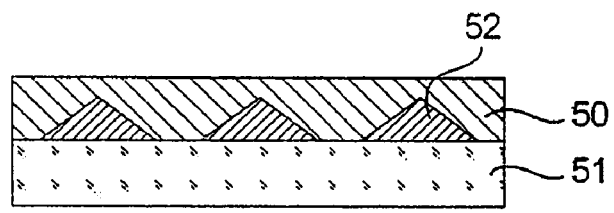
Figure 8D:
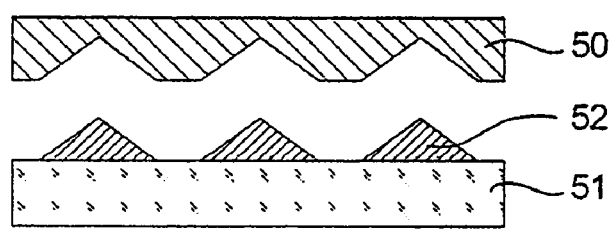

Thus, there are the following steps:

a step to stamp a mould 50 onto a substrate 51 on which an alloy layer 52 is deposited conventionally, (FIGS. 8A and 8B), a mould removal step (FIGS. 8C and 8D).

Mould patterns may be made in several ways:

a mould, for example a silicon mould can be used, and pyramid shaped holes can be made by anisotropic chemical etching (KOH) following crystalline planes. The mould can also be made by hot stamping. The material must be sufficiently thermally and mechanically resistant so that it does not cleave under application of a force.

4) Growth of Carbon Nanotube Tips

Nanotubes (or nanowires) can be made to grow under an electric field so as to orient them. This technique is described in document reference [2]. This document envisages direct growth of networks of carbon nanotubes vertically aligned on flexible plastic substrates using a chemical vapor deposition.

Figure 9A:
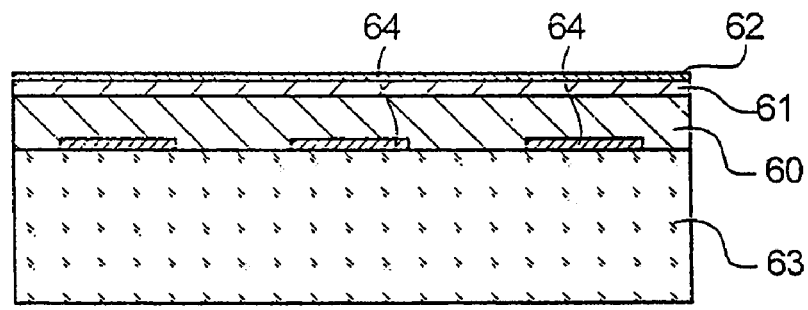
Figure 9B:
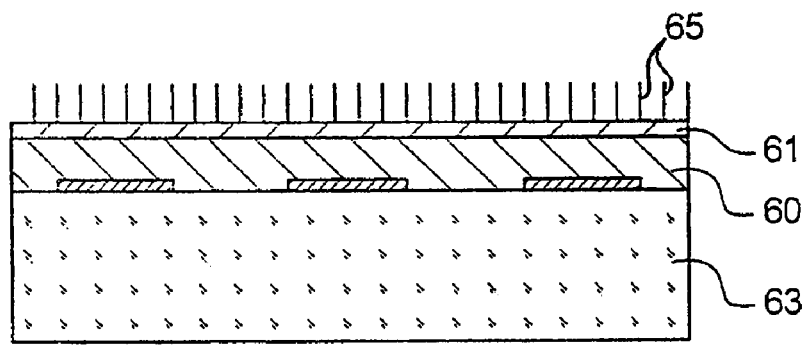

Thus, there are the following steps:

a step to deposit TiN 60, Ni 61 and the catalyst 62 on a substrate 63 provided with pads 64 (FIG. 9A), a step in which the catalyst is put in the form of drops and the nanotubes 65 are grown at 450° C. (FIG. 9B).

Figure 9C:
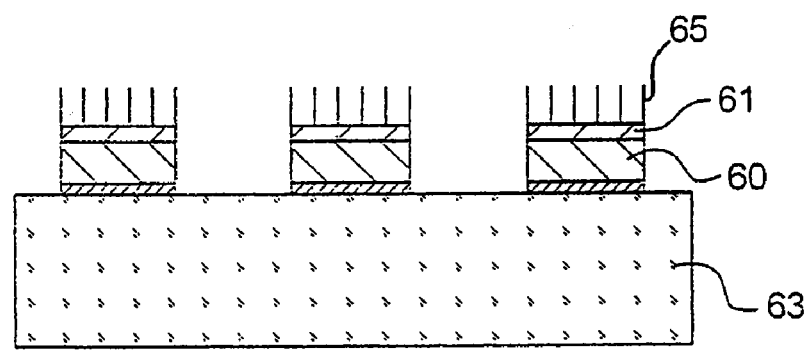

Advantageously, these nanotubes can grow locally using a masking process during the deposition of the various layers necessary for their production (FIG. 9C).

REFERENCES

[1] U.S. Pat. No. 6,179,198

[2] Article entitled "Direct Growth of aligned carbon nanotube field emitter arrays onto plastic substrates" by S. Hofman, C. Ducati, B. Kleinsorge, and J. Robertson (Applied Physics Letters, Volume 83, Number 22, Dec. 1, 2003)

The invention claimed is:

1. Process for making an electrical connection between a first component comprising a set of first pads and a set of hard conducting tips on one face, and a second component comprising a set of second pads and a set of ductile conducting bumps on the other face, in which the two faces are made to face each other and they are brought towards each other such that the tips can penetrate into these bumps, wherein a space between two tips is less than a width of a particular bump and less than a width of a first pad and wherein each tip has an angle of less than 30° at its vertex, and wherein there is a ratio of more than ten between a Young's modulus value of each tip and each bump, the first pads each having a first side and a second side, wherein the tips on at least one of the first pads are equally spaced with respect to one another across the first face from the first side to the second side.

2. Process set forth in claim 1, in which the bumps are obtained by deposition of material at the bottom of the cavities above each second pad, or by etching.

3. Process set forth in claim 1, in which the tips are obtained by metallic deposition, electrolytic growth, metallic nanoprinting, etching or growth of aligned nanotubes.

4. Process set forth in claim 1, wherein the tips extend from the first pads and at least a portion of the one face of the first component not having any of the first pads thereon.

5. Process set forth in claim 1, wherein all the tips are of a same height with respect to the one surface of the first component.

6. Process set forth in claim 1 wherein the space between each adjacent tip is less than the width of a bump and less than the width of a first pad.

7. Process set forth in claim 1, wherein the tips penetrate through at least a substantial portion of the ductile conducting bumps.

8. An electrical connection component comprising a first component including a first face having a set of first pads and a set of hard conducting tips on the first pads and at least a portion of the first face, that can be electrically connected with a second component provided with a set of second pads and a set of ductile conducting bumps on a second face of the second component, wherein the second face faces toward the first face, wherein the space between each adjacent tip is less than the width of a bump and less than the width of a first pad, the first pads each having a first side and a second side, wherein the tips on at least one of the first pads are equally spaced with respect to one another across the first face from the first side to the second side.

9. The component set forth in claim 8, in which each tip is made wholly or partly from an electrical conducting material.

10. The component set forth in claim 8, in which each tip is a nanotube or a nanowire.

11. The component set forth in claim 8, wherein each tip has an angle of less than 30° at its vertex, and wherein there is a ratio of more than ten between a Young's modulus value of each tip and each bump.

12. The component set forth in claim 8, wherein all the tips are of a same height with respect to the first surface of the first component.

13. The component set forth in claim 8, wherein the tips penetrate through at least a substantial portion of the ductile conducting bumps.

14. The component set forth in claim 8, in which each bump is made of at least one electrical conducting material.

15. The component set forth in claim 14, in which the material from which the bump is made is chosen from among a brazing paste or a conducting glue.

16. Process for making an electrical connection between a first component comprising a set of first pads and a set of hard conducting tips on one face, and a second component comprising a set of second pads and a set of ductile conducting bumps on the other face, in which the two faces are made to face each other and are brought towards each other such that the tips penetrate at least substantially through the bumps, wherein a space between two tips is less than a width of a particular bump and less than a width of a first pad and wherein each tip has an angle of less than 30° at its vertex, and wherein there is a ratio of more than ten between a Young's modulus value of each tip and each bump, wherein the tips are linearly equally spaced with respect to one another across the first face from a first side to a second side to define a mat to reduce required precisioning between the first face and the second face.

17. Process set forth in claim 16, wherein at least one tip penetrates through at least one bump at a central bottom portion of the bump.

* * * * *